(12) United States Patent
Van Der Wel

(10) Patent No.: US 8,858,248 B2
(45) Date of Patent: Oct. 14, 2014

(54) HOUSING FOR AN ELECTRICALLY POWERED DEVICE

(75) Inventor: Pieter Van Der Wel, Heerlen (NL)

(73) Assignee: Koninklijke Philips N.V., Eindhoven (NL)

( * ) Notice: Subject to any disclaimer, the term of this patent is extended or adjusted under 35 U.S.C. 154(b) by 81 days.

(21) Appl. No.: 13/810,787

(22) PCT Filed: Jun. 24, 2011

(86) PCT No.: PCT/IB2011/052779
§ 371 (c)(1),
(2), (4) Date: Jan. 17, 2013

(87) PCT Pub. No.: WO2012/010995
PCT Pub. Date: Jan. 26, 2012

(65) Prior Publication Data
US 2013/0114272 A1      May 9, 2013

(30) Foreign Application Priority Data
Jul. 21, 2010 (EP) .................................... 10170219

(51) Int. Cl.
*H01R 13/703* (2006.01)
*F21V 25/04* (2006.01)
*F21V 15/01* (2006.01)
*H01R 33/96* (2006.01)
*H05K 5/00* (2006.01)
*F21K 99/00* (2010.01)
*F21Y 101/02* (2006.01)

(52) U.S. Cl.
CPC ........... *H05K 5/0091* (2013.01); *F21Y 2101/02* (2013.01); *F21V 25/04* (2013.01); *F21V 15/01* (2013.01); *H01R 33/96* (2013.01); *F21K 9/175* (2013.01)

USPC .......................................................... 439/188

(58) Field of Classification Search
CPC ....................................................... H01R 13/703
USPC ............. 439/188, 231; 200/51.09; 362/217.1, 362/221
See application file for complete search history.

(56) References Cited

U.S. PATENT DOCUMENTS

| 1,802,838 | A | * | 4/1931 | Sakakura | ........................ 315/66 |
| 3,083,274 | A | * | 3/1963 | Sparkes | ..................... 200/51.09 |
| 4,120,552 | A | * | 10/1978 | Winkler et al. | .................. 439/95 |
| 4,230,386 | A | * | 10/1980 | Farnworth et al. | ............. 439/188 |

(Continued)

FOREIGN PATENT DOCUMENTS

| GB | 2111767 A | 7/1983 |
| GB | 2319901 A | 6/1998 |
| JP | 2012-195271 | * 11/2012 |

*Primary Examiner* — Neil Abrams
(74) *Attorney, Agent, or Firm* — Meenakshy Chakravorty

(57) ABSTRACT

There is provided a housing comprising an electrically powered device and electrical connecting means. The (electrical connecting means of the) housing fits an interface means of an electrical power supply. The housing is provided with one or more protruding elements movable between an idle position and a depressed position. In the idle state the one or more protruding elements prevent an electric current from passing between the electrical connecting means and the electrically powered device. The interface means comprise a front side which interacts with the one or more protruding elements by pushing the one or more protruding elements into the depressed state, thereby enabling an electric current to pass between the electrical connecting means and the electrically powered device exclusively when the housing has been properly installed.

9 Claims, 4 Drawing Sheets

(56) References Cited

U.S. PATENT DOCUMENTS

| | | | |
|---|---|---|---|
| 5,118,301 A * | 6/1992 | Bentivolio | 439/188 |
| 7,209,331 B2 * | 4/2007 | Shoop et al. | 361/42 |
| 7,344,398 B2 | 3/2008 | Sibout | |
| 8,147,091 B2 * | 4/2012 | Hsia et al. | 362/221 |
| 8,322,878 B2 * | 12/2012 | Hsia et al. | 362/221 |
| 8,459,831 B2 * | 6/2013 | Hsia et al. | 362/221 |
| 2010/0181178 A1 | 7/2010 | Chang et al. | |
| 2011/0149563 A1 | 6/2011 | Hsia | |
| 2012/0155074 A1 * | 6/2012 | Mori et al. | 362/221 |
| 2013/0114272 A1 * | 5/2013 | Van Der Wel | 362/362 |

\* cited by examiner

HOUSING FOR AN ELECTRICALLY POWERED DEVICE

FIELD OF THE INVENTION

The present invention relates in general to a housing for an electrically powered device, and in particular to a housing for an electrically powered device enabling safe installation of the same.

BACKGROUND OF THE INVENTION

For a high market penetration of solid state light sources (LED lamps), at the time being, retrofit lamps are considered quite important. This also includes TL tubes. There are some types of housing for such electrically powered devices which have electrical connecting means (for connecting the electrically powered device to the mains power supply) at opposite ends of the housing. Thus during installation one end may still be exposed whilst the other end has been connected to the mains power supply. There are also some types of housing for such electrically powered devices which have all electrical connecting means at one end. In some cases the mechanical design of the housing, may prevent the "right" electrical connecting means from being connected to the "right" interface means of the mains power supply in a "wrong" way. Thereby unsecure installation may be prevented. But in other cases this does not prevent the electrical connecting means from being connected to the "wrong" interface means or in a "wrong" way.

Thus, with current solutions, there might be a safety issue during installation. The potential hazard described above may relate (only) to LED retrofit electrically powered devices, as their internal structure may provide a current path through the electrically powered device. In contrast to this, a gas filled tube for lighting may not conduct any current unless ignited by the ignition voltage, which may require connection at both ends of the electrically powered device. Hence, due to the nature of the different types of electrically powered devices the installer might not be aware of the potential hazard originating from the uninstalled pins.

Hence, there is a need for an improved lighting arrangement, such as retrofit lamps, enabling more secure installation.

SUMMARY OF THE INVENTION

It is an object of the present invention to overcome this problem, and to provide an improved housing for an electrically powered device.

It is an object of the present invention to provide a housing that fulfils requirements relating to safe handling of the electrically powered device comprised in the housing, and particularly to enable safe installation of the electrically powered device.

Generally, the above objectives are achieved by a housing for an electrically powered device according to the attached independent claim. According to a first aspect of the invention, this and other objects are achieved by a housing for an electrically powered device, the housing having an electrically powered device attached thereto, comprising: electrical connecting means for electrically connecting the electrically powered device to interface means of an electrical power supply, the interface means having a front side; and a protruding element movable between an idle position and a depressed position; the protruding element preventing an electric current from flowing between the electrically powered device and the electrical connecting means in the idle position unless being pushed into the depressed position by the front side in connecting the housing to the interface means.

Advantageously such a housing allows a current to flow between the electrically powered device and the electrical connecting means only when the protruding element is depressed by the front side of the interface means in connecting the housing to the interface means. Thereby there will not be any voltage present at electrical connecting means which are exposed, hence enabling secure installation. Advantageously the disclosed housing thus provides simple mechanical means for enabling secure installation of the electrically powered device.

According to embodiments the housing further comprises spring means arranged to push the protruding element into the idle position. According to embodiments the spring means are flexible between an un-stressed state and a stressed state, the protruding element being pushed by the spring means into the idle position in the un-stressed state.

Advantageously the spring means may hinder that the protruding element is moved into the depressed state my accident.

According to embodiments the spring means are arranged to lead a current between the electrically powered device and the electrical connecting means exclusively in the stressed state. Advantageously the spring means may thereby lead the current unless being pushed into the stressed state by the protruding element.

According to embodiments the housing has at least two electrical connecting means and at least two protruding elements, the electrical power supply being associated with two front sides, whereby in connecting the housing to the interface means each one of the at least two protruding elements is pushed by a respective one of the front sides, thereby allowing the electric current to flow between the electrically powered device and the electrical connecting means.

Advantageously the electrical connecting means is paired with front sides, thereby enabling even more secure installation. Advantageously, enabling two protruding elements to be pushed by only one front side may allow for a simple and cheap but still effective interface means to be provided. Depending on the number of electrical connections required for the specific application and the geometrical arrangement of the interface, even only one front side may be used as the most simple and cheap but still effective and safe interface means.

According to embodiments the housing has a first end and a second end, and a first of the electrical connecting means is arranged at the first end and a second of the electrical connecting means is arranged at the second end, the first and second electrical connecting means being associated with first and second protruding elements, respectively.

Advantageously the provision of the electrical connecting means at respective ends of the housing may provide for even more secure installation.

According to embodiments the first and the second of the electrical connecting means are arranged to be connected to respectively a first and a second interface means of the electrical power supply, or vice versa, each interface means having a respective front side.

According to embodiments connecting the housing exclusively to both first and second interface means allows the electric current to flow between the electrically powered device and the electrical connecting means.

According to embodiments the second end is opposite the first end.

According to embodiments the housing comprises feedback means arranged to provide user feedback relating to movement of the protruding element.

Advantageously this may allow for a user to receive information relating to whether or not the housing has been successfully installed. The feedback means may thus indicate whether or not the electrically powered device is operational.

According to embodiments the feedback means comprise electrically activated movable parts.

According to embodiments the electrically activated movable parts are activated by a current flow established in connecting the housing to the interface.

According to embodiments the electrically powered device is a light source.

Advantageously the disclosed housing may allow secure installation of a light source.

According to embodiments the light source is one from a retrofit tube and a linear TL tube.

According to a second aspect of the invention, the above object and other objects are achieved by a luminaries comprising a housing as disclosed above.

According to a third aspect of the invention, the above object and other objects are achieved by an arrangement for an electrically powered device, comprising a housing as disclosed above and an interface for connecting the housing to an electrical power supply.

It is noted that the invention relates to all possible combinations of features recited in the claims. Thus, all features and advantages of the first aspect likewise apply to the second and third aspects, respectively.

BRIEF DESCRIPTION OF THE DRAWINGS

The various aspects of the invention, including its particular features and advantages, will be readily understood from the following detailed description and the accompanying drawings, in which.

DETAILED DESCRIPTION

Figure 1:
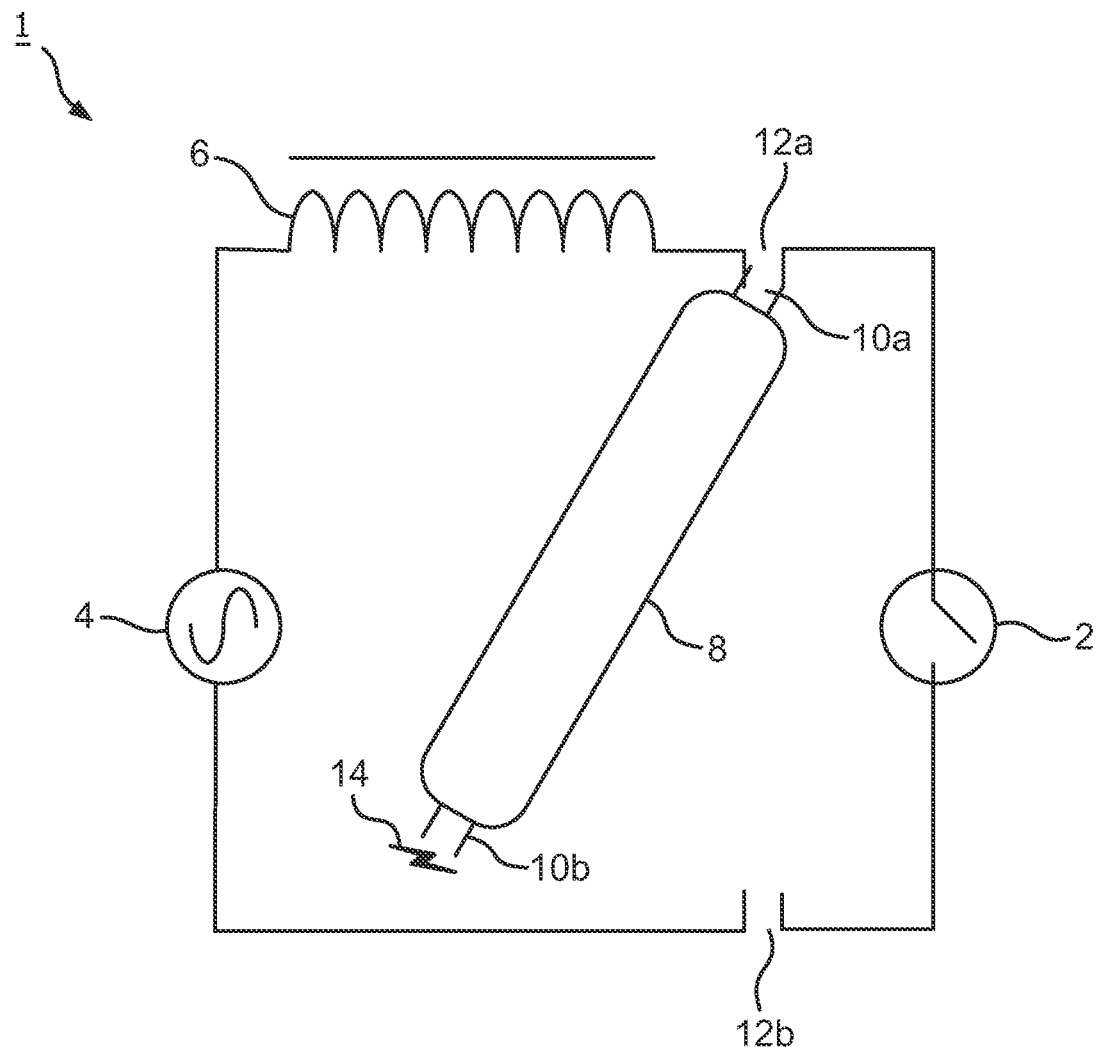
FIG. 1 illustrates a circuit arrangement.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

In order for an electrically powered device to be powered a closed circuit through which electrical current can flow needs to be established. Typical examples of electrically powered devices includes, but are not limited to, light sources, luminaires, LED retrofits of linear TL tubes, and the like. Electrically powered devices are provided with electrical connecting means by which the electrically powered devices can be electrically connected to an interface (such as a device socket or a device holder) of an electrical power supply. Hence, when properly connected to the interface an electrical current may be provided to the electrically powered device. Commonly the electrically powered device has (at least) two electrical connecting means (electrical contacts, such as pins) for connecting the electrically powered device to the electrical power supply (via the interface) to result in a closed current path. Some electrically powered devices have more than two electrical connecting means which enable multiple current paths.

FIG. 1 illustrates a circuit arrangement 1 comprising a housing 8 of a partially installed electrically powered device. The housing 8 has electrical connecting means 10a-b for electrically connecting the electrically powered device to an electrical power supply 4 via interfaces 12a-b. The circuit arrangement 1 further comprises inductive circuitry 6 and a switch 2. The inductive circuit is typically the magnetic ballast while the switch 2 is typically the (glow) starter. During installation of the electrically powered device (i.e. when mechanically and electrically connecting the electrically powered device to the electrical power 4 supply via the interfaces 12a-b) one (pair) of the electrical connecting means 10b may be exposed while the other (pair) of the electrical connecting means 10a, has been connected to interface 12a. Thereby a voltage may be present at the exposed (pair) of the electrical connecting means 10b,, as schematically illustrated at 14. A closed circuit may therefore be formed when contacting the exposed (pair) of the electrical connecting means, thereby enabling an electrical current to flow through the electrically powered device via the exposed (pair) of the electrical connecting means 12b.

Particularly, the inventors of the disclosed embodiments have discovered that there may be an issue with the safety of LED retrofits of linear TL tubes. During installation, it may be possible to insert the electrical connecting means of only one end of the TL tube into the interface of the electrical power supply whilst having the electrical connecting means of the other end still exposed. As a consequence thereof, if an installer (by accident) touches the electrical connecting means on the exposed end he/she may receive an electrical shock from the exposed end. This is especially true since the electrical supply grid is often not isolated from the ground potential. An installer, touching the still exposed connection means may be exposed to a hazardous current flowing through his body to ground and from the ground back to the electrical power supply. Even if there would be a single-pole switch in the off position in one of the connections to the power supply, depending on the position of this switch and the grounding condition, there can still be a current path. Thus, even if the electrically powered device (for example, a light source), which is to be replaced, is not fully connected (for example, the light source does not emit light), this does not guarantee that there will not be a hazardous situation.

Furthermore, for most common electrical connecting means (connectors), where all pins of the electrical connecting means are at the same end (for example the normal mains plug of an electrically powered device), it is (due to the length of the pins and the size of the socket) not possible to connect only one pin whilst leaving the other pin exposed so that it may be (accidentally) touched. However, there are also some types of housing which have all electrical connecting means at one end (such as on a bottom side, on a top side or on another side of the housing). In some cases the mechanical design (geometry, shape, etc.) of the housing and/or interface, possibly together with the placing of the electrical connecting means on the housing, may prevent the electrical connecting means from being connected to the interface means in a "wrong" way, and thereby prevent unsecure installation. But in other cases this does not prevent the electrical connecting means from being connected to the interface means in a "wrong" way.

The potential hazard described above may relate (only) to retrofit tubes, as the power converter/ballast provides a current path through the tube. In contrast to this, a gas filled tube may not conduct any current unless ignited by the ignition voltage, which may require connection at both ends of the electrically powered device. Hence, due to the nature of the different types of electrically powered devices the installer might not be aware of the potential hazard originating from the uninstalled pins.

According to embodiments there is disclosed a housing for an electrically powered device which is provided with one or more protruding element. The protruding element is movable between an idle position and a depressed position. The housing may further comprise spring means arranged to push the protruding element into the idle position. The spring means may be embodied as reed contacts in the retrofit tube. In the idle position the electrical connecting means are isolated (disconnected) from the electrically powered device, thereby preventing current to flow between the electrically powered device and the electrical connecting means. A front side of the interface (such as in the lamp holder) of the electrical power supply pushes the protruding element into the depressed position, and thereby enables current to flow between the electrically powered device and the electrical connecting means. Thus, only the electrical connecting means (such as pins) which are correctly placed in the interface (such as a lamp holder) will be electrically connected. Thereby the safety risk may be reduced or even removed.

Figure 2:
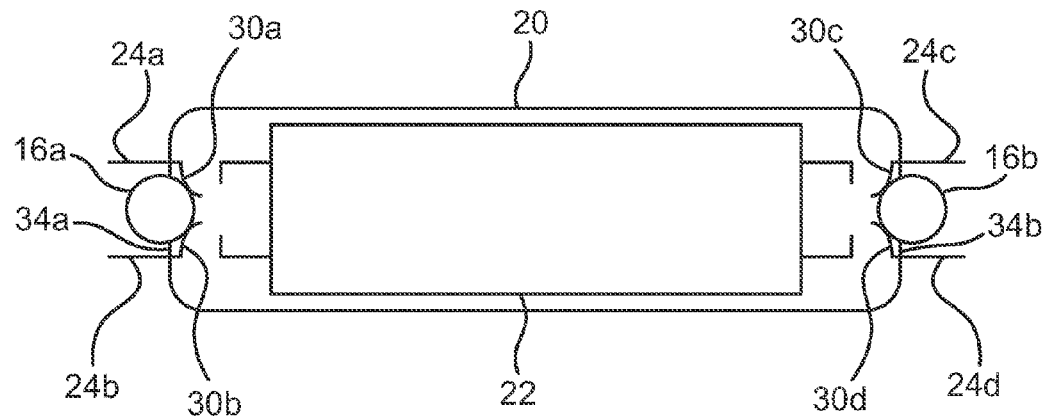
FIG. 2 illustrates a housing for an electrically powered device according to an embodiment.

With reference to FIG. 2 there is provided a housing 20 for an electrically powered device 22. The housing may be a glass housing. The housing may comprise a gas filling. The housing 20 has an electrically powered device 22 attached thereto. According to a preferred embodiment the electrically powered device 22 is a light source. The light source may be a retrofit tube. The light source may be a linear tubular lamp (TL) tube. According to a preferred embodiment the housing is part of a luminaire comprising the housing 20 and the electrically powered device (embodied as a light source).

The housing 20 comprises electrical connecting means 24a-d. The electrical connecting means 24a-d, are arranged to electrically connecting the electrically powered device 22 to interface means 26a-b, of an electrical power supply 4 (see FIG. 3). The interface means 26a-b, may be embodied as device sockets or device holders.

Further, the housing 20 comprises protruding elements 16a-b. The protruding elements 16a-b, are movable between an idle position and a depressed position. The protruding elements 16a-b, may be movable into the idle position by spring means 30a-d comprised in the housing 20 and into the depressed state by a front surface 28a-b, of the interface means 26a-b, (see FIG. 3). The spring means 30a-d, are arranged to, in an un-stressed state, prevent an electric current from flowing between the electrically powered device 22 and the electrical connecting means 24a-d. The spring means may be reed contacts. Reed contacts fit well with tube manufacturing, as both tube and reed contacts are suitable for a glass housing with a gas filling. The current flow is prevented unless the spring means 30a-d are pushed into a stressed state by the protruding elements 16a-b, as the protruding elements 16a-b, receives a push from the front surface 28a-b, of the interface means 26a-b. In a first state, either all the spring means 30a-d, or at least the spring means 30a-d, on one end 34a-b, of the housing 20 are in the open state (see below). The first situation (i.e. all spring means 30a-d, are in the open state) occurs when no end of the housing 20 is inserted into the interface means 26a-b. The second situation (i.e. spring means 30a-d, provided at least on one end are in the open state) occurs when only one end of the housing 20 is inserted into the interface means 26a-b. The spring means 30a-d, are pushed (thereby entering the stressed state) by the protruding elements 16a-b, in connecting the housing 20 to the interface means 26a-b,, thereby allowing electrical power to be provided from the power supply to the electrically powered device. In other words, in the first state, which may also be denoted as a passive state, current is prevented from flowing between the electrically powered device 22 and the electrical connecting means 24a-d,, whereas in the second state, which may also be denoted as an active state, current is allowed to flow between the electrically powered device 22 and the electrical connecting means 24a-d.

An arrangement for an electrically powered device 22 may comprise a housing 20 according to the above and an interface means 28a-b, for connecting the housing to an electrical power supply according to the above. In summary, there will be no current flow possible, unless the protruding elements 16a-d, are pushed into the depressed state.

Figure 3:
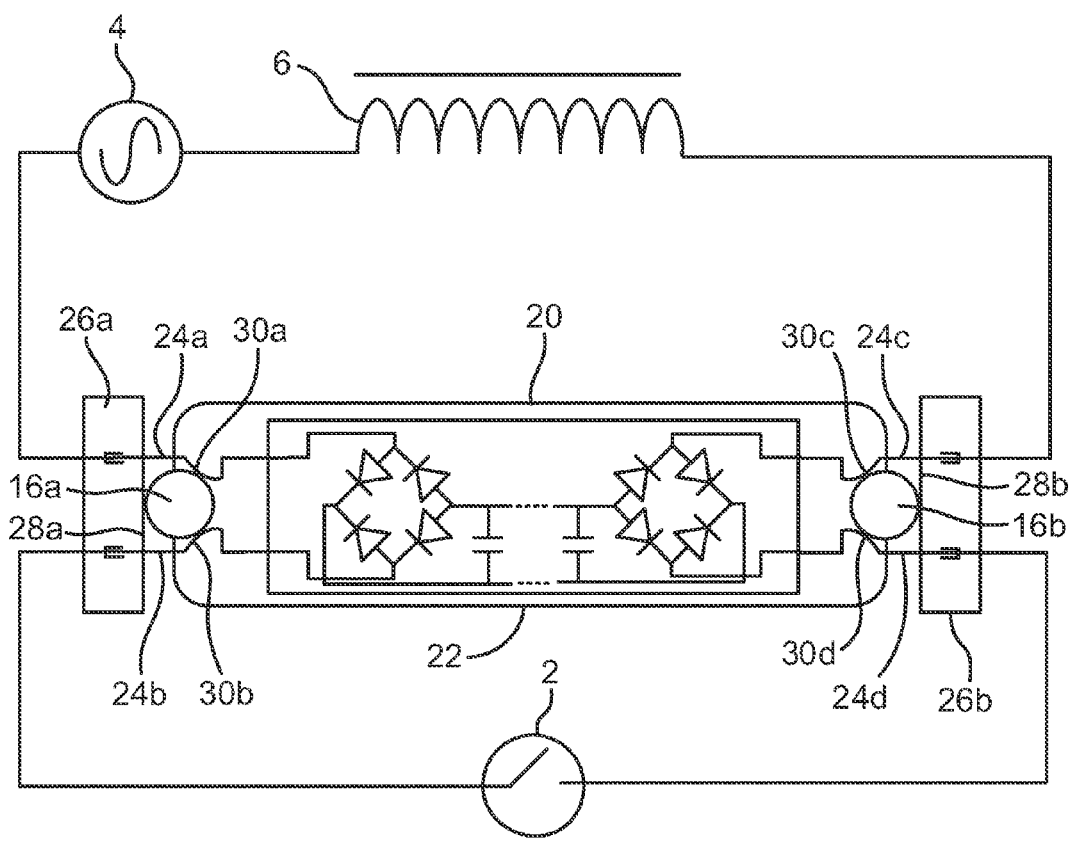
FIGS. 3-6 illustrates housings for an electrically powered device and interfaces according to embodiments.

FIG. 3 illustrates a housing 20 for an electrically powered device 22 as described with reference to FIG. 2. In FIG. 3 the electrically powered device 22 has been electrically connected to a electrical power supply 4 via the interface means 26a-b. Each interface means 26a-b, is provided with a front side 28a-b. Thereby the front sides 28a-b, have pushed the protruding elements 16a-d, into the depressed state, thereby pushing the spring means 30a-d, into the stressed state and thereby enabling a current to flow between the electrical power supply 4 and the electrically powered device 22.

Figure 4:
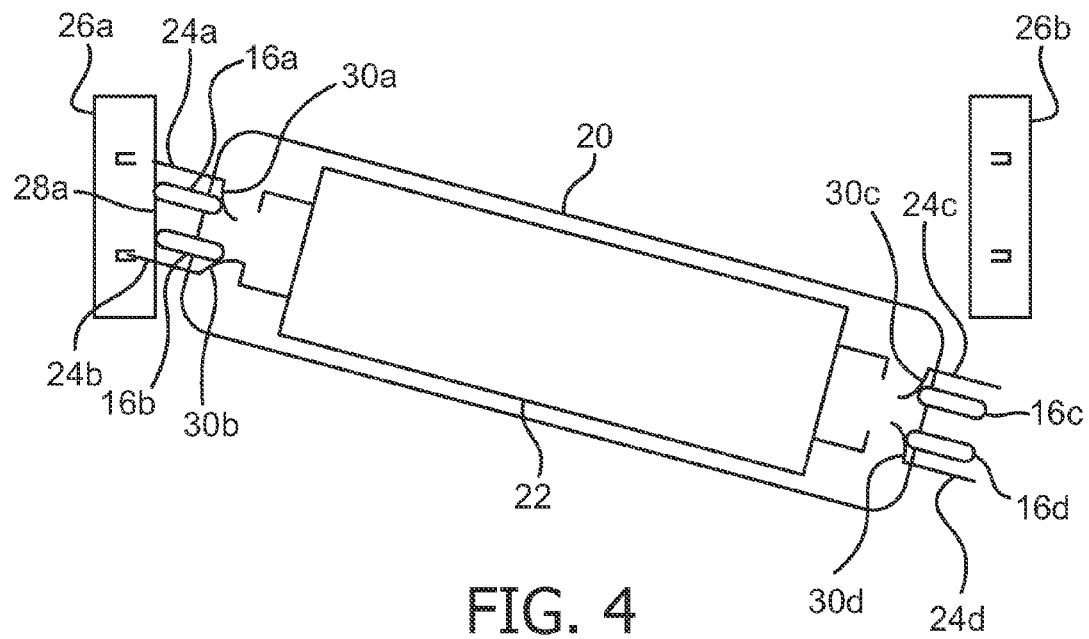

FIG. 4 illustrates a partially installed electrically powered device 22 comprised in a housing 20. In case the housing 20 is not correctly installed, as shown in FIG. 4, the exposed electrical connecting means 24c-d, will be disconnected, so there is no issue with safety (in contrast to the arrangement 1 illustrated in FIG. 1). In more detail, as is apparent from the above a housing 20 comprising the disclosed protruding elements 16a-d, and spring means 30a-d, is (from safety point of view) fool proof. If the front side 28a-b, do not properly push the protruding elements 16a-d, the electrically powered device 22 will not be able to receive any current through the electrical connecting means 24a-d, since the spring means 30a-d, will remain in the un-stressed state. In other words, the disclosed subject matter does not depend on any modifications of the interface means 26a-b. In FIG. 4 electrical connecting means 24b, has been properly installed (e.g. positioned into the interface means 26a, (such as a lamp holder) in the right orientation) and the spring means 30b, has been pushed into the stressed state by the protruding element 16b, whilst electrical connecting means 24a, c-d, have not been properly installed (according to the present exemplary embodiment they are still outside the intended position of the interface means 26a-b). Thus the spring means 30a, c-d have not been pushed into the stressed state by protruding element 16a, c-d.

Each electrical signal is routed through a spring means 30a-d. In case all pins on each side are short circuited, there is only one signal per end and only one switch per end is required. In the general case, it might be beneficial to treat the electrical connecting means 24a,, 24b,, 24c,, 24d, per end separately.

In this case two spring means (30a,, 30b, and 30c,, 30d,, respectively) and two protruding elements (16a,, 16b, and 16c,, 16d,, respectively) may be required per end. In more detail, the housing 20 may have a first end 34a, and a second end 34b. The second end 34b may be opposite the first end 34a. The two electrical connecting means (24a,, 24b, and 24c, 24d,, respectively) may be on different ends of the housing.

For example, a first of the electrical connecting means 24a-b, may be arranged at the first end 34a. A second of the electrical connecting means 24c-d, may be arranged at the second end 34b. The first and the second electrical connecting means may also be associated with first and second protruding elements, respectively.

According to an embodiment the housing 20 has at least two electrical connecting means 24a-d,, at least two spring means 30a-d, and at least two protruding elements 16a-d. Further, the electrical power supply 4 is associated with two front sides 28a-b. In connecting the housing 20 to the interface means 26a-b, each one of the at least two protruding elements 16a-d, is pushed by a respective one of the two front surfaces 28a-b. For example, there may be (at least) two electrical connecting means 24a-d, on each end of the housing 20 or, alternatively, one electrical connecting means 24a-d, at each side of the housing 20. In any of these two cases, each one of the electrical connecting means 24a-d, is, according to the present embodiment, associated with one protruding element 16a-d, wherein each interface means 26a-b, has one front surface 28a-b. For example, the first and the second of the electrical connecting means 24a-d, may be arranged to be connected to respectively a first and a second interface means 26a-b, of the electrical power supply 4, or vice versa. Each interface means 26a-b, may, according to an embodiment, have respective front sides 28a-d. preferably, the housing 20 can be operated in all such positions where all (pins of) the electrical connecting means 24a-d, are connected to (a connector of) the interface means 26a-b. preferably the housing 20 has two equal ends and can be installed in an arbitrary orientation. In other words this should not be interpreted as the fits of the first and second interface means are different. Exclusively connecting the housing to both first and second interface means will allow the electric current to flow between the electrically powered device and the electrical connecting means.

Figure 5:
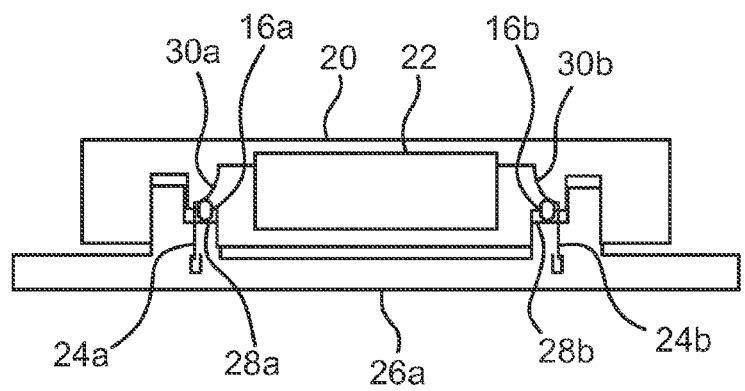

FIG. 5 is a side view of a housing 20 according to an embodiment. The housing 20 may from the top or bottom have a circular shape and may, for example, hold an electrically powered device 22 in form of a light source to be attached to an interface means 26a, of a socket attached to, for example, a ceiling, a floor, a machine, a piece of furniture or a wall. The housing 20 comprises protruding elements 16a-b, and spring means 30a-b, arranged to be pushed by the front side 28a-b,, thereby allowing or preventing, depending on the state of the protruding elements 16a-b, and spring means 30a-b,, a current to flow between electrical connecting means 24a-b, and the electrically powered device 22. According to the exemplary embodiment illustrated in FIG. 5 the shape of the housing 20 and interface means 26a, may prevent the housing from being attached to the interface means 26a, in an erroneous way.

Figure 6:
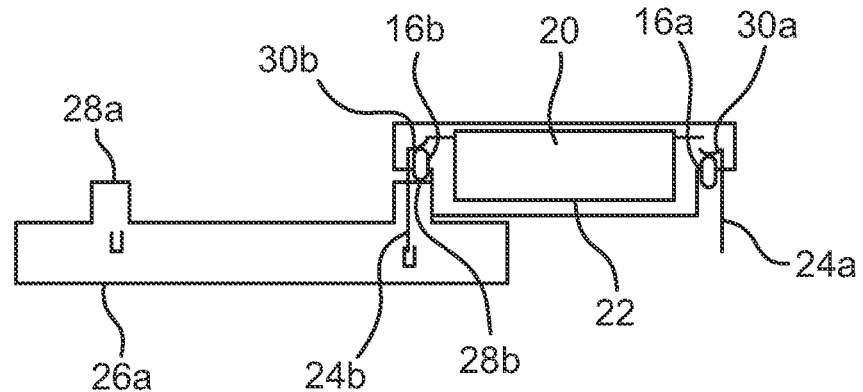

FIG. 6 is, according to an embodiment, a side view of a housing 20 attached to an interface means 26a, in an erroneous way. According to this exemplary embodiment, the shape of the housing 20 and/or the shape of the interface means 26a, do not necessarily prevent the housing 20 from being attached to the interface means 26a, in an erroneous way: electrical connection means 24b, is allowed to be in electrical contact with the power supply (not shown) whilst electrical connection means 24a, is exposed. One protruding element 16b and spring means 30b, are pushed by front side 28a, thereby connecting one pin of the electrically powered device 22 to the power supply whilst electrical connecting means 24a are exposed. However, the protruding element 16a, and spring means 30a, are not pushed by the front side 28a,, thereby preventing a current to flow between the exposed electrical connecting means 24a, and the electrically powered device 22, hence preventing any hazard when touching the exposed pin of the electrical connecting means 24a.

Figure 7:
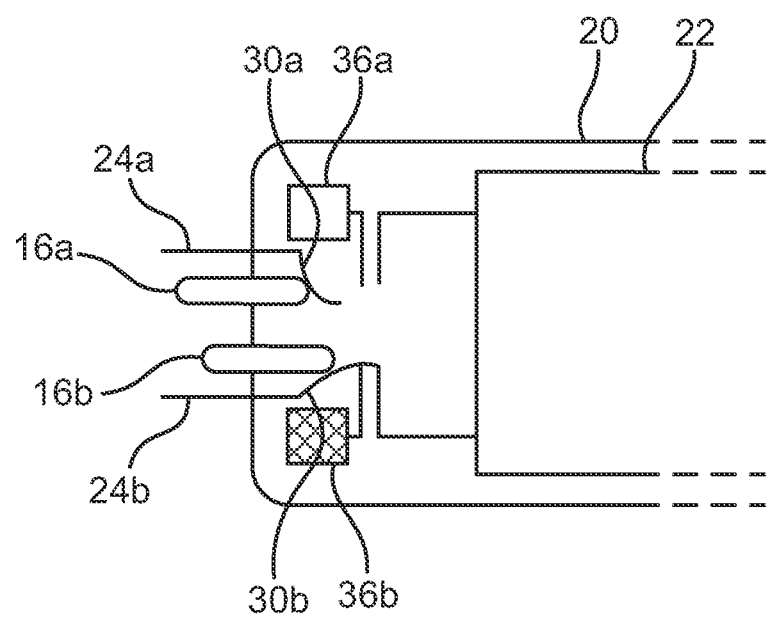
FIG. 7 illustrates part of a housing for an electrically powered device according to an embodiment.

To ease the installation progress, feedback means could be present in or on the housing 20, thereby providing an optical indication of a missing activation signal. FIG. 7 illustrates part of a housing 20 and part of an electrically powered device 22 comprising electrical connecting means 24a-b,, protruding elements 16a-b, and spring means 30a-b. Feedback means 36a-b, in the housing 20 may be activated via the electrical connecting means 24a-b, and the spring means 30a-b, and may be visible from the outer side of the housing 20. Without being activated these feedback means 36a-b, may be visible to indicate that the housing 20 is disconnected from the interface of the electrical power supply (as is the case for feedback means 36a). Alternatively the indicator may be in a visible position as soon as the housing is installed (as is the case for feedback means 36b). Color may for example be used for indication. According to an embodiment the housing 20 thus comprises feedback means 36a-b, arranged to provide user feedback relating to movement of the protruding element 16a-b. The feedback means 36a-b, may be at least partly visible by a user. The feedback means may, for example, comprise electrically activated movable parts. The electrically activated movable parts may be activated by the electrical current flowing between the electrically powered device and the power supply in connecting the housing to the interface.

A common property of the disclosed embodiments is the possibility to provide a solution for retrofit electrically powered devices, such as an retrofit tube. Thus, a normal fixture may be used as a starting point.

The disclosed housing arrangement will work with any electrical circuitry inside the housing and any wiring and ballasting method of the luminaire comprising the interface means 26a-b, (such as, but not limited to magnetic ballast, glow starter, electronic starter, series connection of lamps, HF cold start, HF warm start, shorted pins per end, and the like).

In summary, the disclosed subject matter prevents an electrical current to be delivered to the body of the person installing the housing. Thus, a current may be provided to the electrically powered device comprised in the housing only when the housing, via its electrical connecting means, has been properly installed. Such a housing comprises a load in terms of an electrically powered device, which may be a LED tube. The housing also comprises electrical connecting means, which may take the form of touchable electrical contact pins. The (electrical connecting means of the) housing is realized to fit with an interface means (such as a predefined holder, such as an existing fixture) of an electrical power supply. The housing is provided with spring means which in a passive (un-stressed) isolation state leaves an open connection between the electrically powered device and the power supply. The spring means may thus be said to serve as isolation means for isolation the electrical connecting means when the housing has not been properly installed, thereby preventing an electric current from passing between the electrical connecting means and the electrically powered device. The interface means comprise a front surface serving as activation means for bringing the spring means into an active (stressed) non-isolation state when the housing is properly installed into the interface means by pushing protruding elements from an idle position into a depressed position where the protruding elements in the depressed position affects the spring means to enter the stressed position, thereby allowing an electric current to pass between the electrical connecting means and the electrically powered device.

The person skilled in the art realizes that the present invention by no means is limited to the preferred embodiments described above. On the contrary, many modifications and variations are possible within the scope of the appended claims.

The invention claimed is:

1. A housing accommodating an electrically powered device said housing comprising:
   electrical connecting means for electrically connecting the electrically powered device to interface means of an electrical power supply, the interface means having a front side;
   a protruding element movable between an idle position and a depressed position; the protruding element preventing an electric current from flowing between the electrically powered device and the electrical connecting means in the idle position unless being pushed into the depressed position by the front side in connecting the housing to the interface means; and
   springs means arranged to push the protruding element into the idle position, and further arranged to lead a current between the electrically powered device and the electrical connecting means exclusively in the stressed state.

2. The housing according to claim 1, wherein the spring means are flexible between an un-stressed state and a stressed state, the protruding element being pushed by the spring means into the idle position in the un-stressed state.

3. The housing according to claim 1, wherein the housing has at least two electrical connecting means and at least two protruding elements, the electrical power supply being associated with two front sides, whereby in connecting the housing to the interface means each one of the at least two protruding elements is pushed by a respective one of the front sides, thereby allowing the electric current to flow between the electrically powered device and the electrical connecting means.

4. The housing according to claim 1, wherein the housing has a first end and a second end, and wherein a first of the electrical connecting means is arranged at the first end and a second of the electrical connecting means is arranged at the second end, the first and second electrical connecting means being associated with first and second protruding elements, respectively.

5. The housing according to claim 4, wherein the first and the second of the electrical connecting means are arranged to be connected to respectively a first and a second interface means of the electrical power supply, or vice versa, each interface means having a respective front side.

6. The housing according to claim 5, wherein connecting the housing exclusively to both first and second interface means allows the electric current to flow between the electrically powered device and the electrical connecting means.

7. The housing according to claim 5, wherein the second end is opposite the first end.

8. The housing according to claim 5, wherein the housing comprises feedback means arranged to provide user feedback relating to movement of the protruding element.

9. The housing according to claim 5, wherein the electrically powered device is a light source.

* * * * *